United States Patent [19]

Flamm

[11] Patent Number: 5,304,282

[45] Date of Patent: Apr. 19, 1994

[54] PROCESSES DEPENDING ON PLASMA DISCHARGES SUSTAINED IN A HELICAL RESONATOR

[76] Inventor: Daniel L. Flamm, 476 Green View Dr., Walnut Creek, Calif. 94596

[21] Appl. No.: 686,763

[22] Filed: Apr. 17, 1991

[51] Int. Cl.$^5$ .............................................. H01L 21/00
[52] U.S. Cl. ..................................... 156/643; 156/345; 118/723 E; 427/551
[58] Field of Search .................. 156/643, 345; 427/38, 427/551; 118/723 E

[56] References Cited

U.S. PATENT DOCUMENTS

| | | |
|---|---|---|
| 4,033,287 | 7/1977 | Alexander et al. ................ 118/49.1 |
| 4,310,380 | 1/1982 | Flamm et al. ....................... 156/643 |
| 4,368,092 | 1/1983 | Steinberg et al. . |
| 4,918,031 | 4/1990 | Flamm et al. ....................... 156/643 |

OTHER PUBLICATIONS

"Coaxial Resonators with Helical Inner Conductor"; Proceedings of the IRE; ©1958; pp. 2099–2105; Macalpine et al.

"Application of a Ion-Pressure Radio Frequency Discharge Source to Polysilicon Gate Etching"; Cook et al.; J. Vac. Science B 8(1); Feb. 1990; pp. 1–4.

"Silicon Oxide Deposition From Tetraoxysilane in a Radio Frequency Downstream Reactor: Mechanisms and Step Coverage"; Selamoglu et al.; J. Vac. Science B 7(6); Dec. 1989; pp. 1345–1351.

Primary Examiner—William A. Powell
Assistant Examiner—George Goudreau
Attorney, Agent, or Firm—Roger S. Borovoy

[57] ABSTRACT

Plasma etching and deposition is accomplished utilizing a helical resonator constructed with an inner diameter coil greater than 60 percent of the outer shield diameter. The diameter of the conductor used to form the coil is not critical and can be less than 40 percent of the winding pitch in some applications. These parameters permit helical resonator plasma sources to be more compact and economical, and facilitate improved uniformity for processing large substrates.

18 Claims, 1 Drawing Sheet

PROCESSES DEPENDING ON PLASMA DISCHARGES SUSTAINED IN A HELICAL RESONATOR

BACKGROUND AND FIELD OF THE INVENTION

1. Field of the Invention

This invention relates to plasma processing and in particular to plasma processing of devices using a helical resonator.

2. Description of the Prior Art

Plasma discharges are extensively utilized in the fabrication of devices such as semiconductor devices and, in particular, silicon semiconductor devices. For example, plasma discharges in appropriate precursor gases are utilized to induce formation of a solid on a deposition substrate. (One important embodiment of such a procedure is called plasma assisted chemical vapor deposition.) In a second plasma dependent procedure, species generated in a plasma are utilized to etch a substrate, e.g. a device substrate being processed which generally includes dielectric material, semiconductor material and/or material with metallic conductivity.

In plasma-assisted deposition procedures the desired solid is commonly formed by the reaction of a gas composition in a discharge. In one variation, reactive radical(s) formed in the plasma region, either alone or as mixed outside of the discharge region with a second gas, are flowed over a deposition substrate remote from the discharge to form the desired solid film. In another variation, the substrate is surrounded by a plasma which supplies charged species for energetic ion bombardment. The plasma tends to aid in rearranging and stabilizing the film provided the bombardment is not sufficiently energetic to damage the underlying substrate or the growing film.

In some etching procedures, a pattern is etched into the substrate by utilizing a mask having openings corresponding to this pattern. This mask is usually formed by depositing a polymeric photosensitive layer, exposing the layer with suitable radiation to change the solubility of the exposed regions, and then utilizing the induced change in solubility to form the desired pattern through a solvation process. In other etching procedures, an overlayer of material is selectively removed from the sublayers without use of a mask (the polymeric mask itself can be removed by this procedure after a pattern is transferred. This etching procedure is termed stripping).

For most present day device applications, it is desirable to produce etching at an acceptable etch rate. (Acceptable etch rates depend upon the material to be removed and are generally those that remove at least 2% of the layer thickness in a minute.) Additionally, the production of a relatively high etching rate leads to shorter processing times.

In one etching method known as anisotropic etching, appropriate charged species generated in the plasma produce directional energetic ion bombardment that induces etching on the substrate surface. Another etching procedure known as isotropic etching utilizes reactive neutral species produced by the plasma to induce etching of the substrate.

Various structures for producing the desired plasma discharges have been employed. For example, planar parallel plate reactors and reactors having hexagonal electrodes as described in D. L. Flamm et al., *Plasma Etching An Introduction*, ed. D. M. Manos and D. L. Flamm, Academic Press, San Diego, 1989, pp. 2–87, have been employed to induce anisotropic etching. Planar reactors have also been used to produce species for isotropic etching (as described in U.S. Pat. No. 4,310,380 dated Jan. 12, 1982) and for the deposition of thin films (as described in U.S. Pat. No. 4,033,287 dated Jul. 5, 1977). It is well known to the worker in the field that when appropriate gaseous chemistries are employed, such as those described by V. M. Donnelly and D. L. Flamm in *Solid State Technology*, pp. 161–166 (April, 1981), species from practically any plasma discharge apparatus can be used to induce isotropic etching and anisotropic etching can be achieved with appropriate chemistries using suitable pressures and reactor geometries. (Representative chemistries and conditions are described by D. L. Flamm in *Plasma Etching An Introduction*, ed. D. M. Manos and D. L. Flamm, Academic Press, San Diego, 1989, pp. 91–183.)

Radiofrequency structures such as helicon antenna structures and helical resonators have also been used to generate plasmas which form appropriate anisotropic and isotropic etching species. For example, D. Vender, "Etching in an Externally Excited RF Plasma," Physics Research Laboratory Report No. 87, The Australian National University, Oct. 28, 1988 describes isotropic and anisotropic etching below 10 mTorr in a helicon structure while isotropic etching conducted above 10 mTorr is described in U.S. Pat. No. 4,368,092 dated Jan. 11, 1983.

The helical resonator includes an outside shield enclosure of an electrically conductive material, e.g. a cylinder, an internal helical coil of an electrically conductive material, if desired, an applied magnetic field in the region enclosed by the coil to enhance electron confinement, and means for applying an RF field to the coil. Typically, the outside enclosure and helical coil is of an electrically conductive material such as copper. Design of helical resonators with cylindrical outside enclosure is generally discussed in W. Sichak, *Proc. of IRE*, page 1315 (1954). However helical resonators used to sustain plasma discharges have been constructed according to the criteria, design rules and specifications in W. W. Macalpine et al., Proc. of IRE, page 2099 (1959) and generation of a plasma with these resonators is described in C. W. Haldeman et al, Air Force Research Lab Technical Research Report, 69-0148 accession No. TL501.M41, A25 No. 156. The cross section view in FIG. 2 on page 2100 of Macalpine et al. illustrates the helical resonator components of a helical resonator plasma discharge structure. The symbols used in the following discussion correspond to those in FIG. 2 of Macalpine. Macalpine et al. teach that to obtain optimum electrical characteristic the ratio of d/D of the mean diameter of the helical inner coil of the resonator, d, to the inside diameter, D, of the outside enclosure is chosen to have a value between 0.4 and 0.6 and further that the ratio, $d_o/\tau$ of the diameter of the wire from which the coil is wound, $d_o$ to the pitch of the coil, $\tau$, (the pitch is the number of turns per lineal inch in a direction parallel to the central axis of the structure) is chosen to have a value between 0.4 and 0.7. (For this purpose optimum electrical characteristic is a high unloaded electrical Q, commonly represented by the symbol $Q_u$. $Q_u$ is the Q inherent to a helical resonator structure when there is no plasma present, i.e. a plasma has not been ignited. In general, Q is defined as the maximum instantaneous energy stored in the resonator during a cycle of the excitation frequency divided by the power dissipated in the resonator structure during a cycle of the RF excitation. For the purpose of measuring unloaded Q, plasma ignition may be suppressed by evacuating the dielectric tube to below $10^{-6}$ Torr, or pressurizing the tube to 760 Torr with an inert gas such as helium).

It is well known to workers in the field that the same design principles utilized for resonators with circular outside shields also apply to helical resonators with an outside shield in the form of a simple polygonal cross section. For example, the design of helical resonators with shield of square cross section is described in Zverev et al., *IRE Transactions on Component Parts*, pp. 99–110, Sept. 1961. Zverev et al. teach that a square shield with side of length S is equivalent in properties to a circular cylindrical shield of diameter 1.2 S.

The plasma discharge is contained within a low loss dielectric, insulating enclosure (e.g., a quartz tube) that passes through the helical coil and is preferably concentric with the inner coil of the resonator. The dimensions of the dielectric enclosure must be less than the inner diameter of the helical coil.

It is possible to operate the helical resonator discharge in a quarter wave mode (as described by Haldeman) or in a half wave mode as employed in the plasma polymerization coating process described by S. L. Letts et al. in "Laser Program Annual Report—1978, Volume 1, Lawrence Livermore Laboratory Report UCRL-50021-78, edited by M. J. Monsler and B. D. Jarman, pp. 4-7 through 4-11, March 1989. (A detailed blueprint for a production version of this helical resonator plasma deposition coating reactor is contained in Lawrence Livermore Laboratory Drawing No. AAA-78-107861-00 created by R. Dowrick in 1978. S. Letts of the Lawrence Livermore Laboratory has informed me that this design was made freely available to other laboratories prior to 1985 and units were constructed according to this blueprint and operated by KMS Fusion, Inc. of Ann Arbor Mich. and the University of Rochester.) In the quarter wave mode it is possible to connect one end of the coil to the outer shield and to insulate and separate the opposite end from the shield to reduce capacitance coupling. In a half wave mode device both ends are advantageously grounded (Grounding, although not essential to its operation, tends to reduce coupling to metallic objects near the ends and improves confinement of the plasma).

Rather weak magnetic fields may be used to enhance the plasma density obtained from RF resonant structures. For example, Boswell et al. in Applied Physics Letters, 50, 1130 (1987) show that the plasma density downstream of an inductively coupled source operating below 1 mTorr is more than doubled when a magnetic field strength of about 20 gauss is applied.

It is possible to position longitudinally conducting elements along the outside of the low loss dielectric discharge tube. For example, the Lawrence Livermore Laboratories coating reactor utilizes a split metallic shield between the outside of the quartz tube and the resonator coil. A heater formed from longitudinal conducting elements with relatively high circumferential resistance can be advantageously used to heat substrates positioned within the discharge tube to permit chemical vapor deposition at elevated temperature as was described by G. Cicala at the NATO Advanced Study Institute on Plasma-Surface Interactions and Processing of Materials in Alicante, Spain, Sep. 4–16, 1988. (An abbreviated summary of this process is in G. Cicala et al., *Plasma-Surface Interactions and Processing of Materials*, edited by O. Auciello et al., NATO ASI Series E: Applied Sciences, Vol. 176, Kluwer Academic Publishers, The Netherlands, 1990, pps. 171–173).

It is well known that pulsing the power to the plasma discharge or pulsing the feed gas flow can be advantageous for higher deposition rates, improved etching anisotropy or better uniformity under appropriate conditions (for example, G. Cicala et al. describe a pulsing procedure useful to increase deposition rates).

Helical resonator plasma structures are simple to manufacture compared to other large diameter plasma sources that are useful for deposition and etching such as electron cyclotron resonance reactors (see Suzuki et al. *Journal of the Electrochemical Society*, 126, 1024 (1979) for a description of etching in this type of reactor, commonly referred to as ECR). However helical resonator reactors have not been entirely desirable in the past because their design was thought to be limited to the range of dimensional ratio and size parameters given by Macalpine et al. Resonators which conform to the scaling relationships taught by Macalpine et al. tend to be cumbersome and may be unsuitable for device processing. This will be illustrated by example below.

To achieve a highly uniform etching rate (when the plasma is used for etching) or a highly uniform rate of chemical vapor deposition which is required to grow an even film thickness over the entire surface of a substrate, the diameter of the inner dielectric tube within the resonator should be as large or preferably larger than the substrate that is to be processed. Plasma sources having a diameter that is smaller than the substrate diameter tend to produce nonuniform rates. (When the etching rate is nonuniform, it may nonetheless be possible to etch a film layer for device fabrication if the inherent chemical selectivities for etching the film relative to the masking layer and film sublayer are sufficiently high. However such nonuniformity is undesirable because it reduces process latitude. Precise selectivity requirements corresponding to specified etch rate variability are determined from the mathematical relationships published in Flamm et al., *Plasma Etching An Introduction*, ed. D. M. Manos and D. L. Flamm, Academic Press, San Diego, 1989, pp. 91–183, and incorporated herein by reference.) In addition, tube diameters which are smaller than the substrate diameter tend to produce divergent plasma flows when species from the resonator source move radially to reach the surface that is etched. To meet high accuracy pattern transfer requirements for submicron device manufacture, trajectories of ions impacting the substrate surface should be collinear and perpendicular to the substrate surface. A divergent plasma flow such as that from a narrow tube to a wider diameter substrate tends to induce a systematic variation in the angle between ion trajectories and a perpendicular to the surface which limits the size of a substrate and the minimum feature dimensions which can be processed (the effects on etching characteristics are discussed by S. Samukawa et al. in "Proceedings of the 1989 Dry Process Symposium," pp. 27–32, published by The Institute of Electrical Engineers of Japan, Tokyo, 1989).

A high unloaded helical resonator Q has been considered essential for the operation of helical resonator plasma structures. Consequently, helical resonators made to sustain plasma discharges have hitherto been constructed in conformance with the dimensional scaling relationships for optimum Q taught by Macalpine et al. These scaling relationships require the ratio, d/D, of the coil diameter, d, to the shield diameter, D, to be between 0.45 and 0.6. Additionally, Macalpine et al. teach that the ratio, b/D, of the axial length of the coil, b, to the diameter of the shield, D, be greater than 1 (b/D>1) and that the diameter ($d_o$) of the conductor used to wind the inner coil is fixed at a value between 0.4 and 0.7 times the coil pitch (the coil pitch is defined as the length of the coil divided by the number of turns in the coil). Indeed the importance of high Q and the use of this scaling law for isotropic helical resonator etching reactors are emphasized by Steinberg et al. in U.S. Pat. No. 4,368,092 dated Jan. 11, 1983. Cook et al. (in the *Journal of Vacuum Science and Technology* B, pps. 1–4, 1990 and also in the *Journal of Vacuum Science and Technology* A, pps. 1820–1824, 1991) state that resonator structures suitable for helical resonator discharge sources used for anisotropic etching generally have an unloaded Q of 1000–2000 and a high $Z_o$. ($Z_o$ is the characteristic impedance of the helical resonator as given in Reference *Data for Radio Engineers*, fourth edition, pp. 600–603, ed. H. P. Westman, International Telephone and Radio Corp., New York, 1956 and incorporated by reference herein.) Furthermore helical resonator structures employed for plasma assisted chemical vapor deposition such as the designs used for polymer deposition by Letts et al., as well as the resonator employed by Cicala et al., and the apparatus used for downstream silicon oxide deposition by Selamoglu et al. (as described in *The Journal of Vacuum Science and Technology* B 7, 1345, 1989) were constructed with the dimensional relationships for high Q taught by Macalpine and Schildknecht.

However the scaling relationships taught by Macalpine et al. yield helical resonator structures with dimensions that tend to be cumbersome, and are often unsuitable or unduly constraining for device processing. In both of the referenced reports Cook et al. note that the diameters of quartz discharge tubes in the resonators they used not only were smaller than the inner coil diameter, but had to be further limited because of the space occupied by dielectric material needed to support the helical coil. This bulkiness and the tube size constraint limit the usefulness of helical resonator discharge structures conforming to formulae given in Macalpine et al. The seriousness of this limitation is illustrated by the following two examples.

EXAMPLE 1

Films on 150 millimeter and 200 millimeter diameter silicon wafers are etched using plasma assisted techniques for the production of integrated circuits. In the manufacture of these circuits, films are also deposited on wafers of this size by plasma assisted chemical vapor deposition. When wafers are processed downstream of a helical resonator discharge such as that illustrated in FIG. 1, the inside diameter of the dielectric discharge tube (26) in the helical resonator structure is preferably larger than the substrate wafer diameter (42) in order to avoid excessive plasma divergence and to achieve a high flux of reactive species downstream of the discharge. Furthermore it may be desirable to process wafers within the resonator plasma volume (40) as exemplified by the silicon nitride deposition process described by Cicala et al. In order to process wafers within the resonator plasma, the inner diameter of the dielectric tube (26) must be significantly larger than the diameter of the substrate ((42) to allow the wafers to be supported in this volume for processing. Thus a quartz inner tube with an inside diameter in excess of 250 millimeters is suitable for processing 200 millimeter diameter wafers. A useful wall thickness for this tube is 1/16 inch. A space of at least ½ inch between the inner diameter of the helical coil and the outer wall of the quartz tube is appropriate to accommodate normal variability in tube dimensions and to facilitate tube insertion during assembly. (At this point we assume the diameter of a wire conductor used to wind the spiral resonator coil is 1.2 inches. Therefore the diameter, d, of the coil (22) needed to accommodate this 250 mm discharge tube will be about 13 inches. The scaling relations given by Macalpine et al. require that the diameter of the shield surrounding a 13-inch coil be at least 1.66 times this diameter which is in this instance is 21.6 inches. According to the scaling relations, the overall length of the resonator structure is chosen to be about two times the coil diameter or 21.6 inches. Thus accepted teaching requires that minimum dimensions of a resonator structure for processing 200 millimeter wafers be approximately 21.6 inches in diameter and 21.6 inches in height, exclusive of the vacuum chamber dimensions (44) and wafer loading mechanisms (loading mechanisms are not a feature of this invention and hence are not shown in FIG. 1. FIG. 4 in Macalpine et al. determines that for operation at 13.56 MHz a helical resonator constructed with above dimensions will have approximately 6 turns of wire at a pitch, τ of about 3 inches per inch for operation at 13.56 MHz (this frequency is allocated for industrial use and is the most common frequency used for plasma processing). The diameter of the conductor used to wind this coil then is chosen to be 1.2 inches from the permitted range of 1.2–2.1 inches satisfying the limits $0.4<d_o/\tau<0.7$ given by Macalpine. (Note that this is consistent with the wire diameter already chosen). The discharge tube thus subtends less than half of the overall diameter of this structure and the large conductor structures are massive and bulky.

EXAMPLE 2

Recently it has been found that RF plasma excitation frequencies above 13.56 MHz (for example in the range of 50 MHz) can be advantageous to reduce harmful effects of the plasma on electrical characteristics of a completed device (described, for example, by Goto et al. in *Solid State Technology*, 34(2), pp. S13–S16, February 1991). Although helical resonator reactors constructed for 13.56 MHz operation according to the teachings of Macalpine et al. are quite inconvenient, corresponding designs for operating at higher frequency are impractical. For example, a resonator structure constructed with dimensions suitable for processing 200 millimeter wafers and operating with 50 MHz excitation should contain an inside coil diameter of approximately 13 inches diameter as described above. Thus the required outside shield diameter is about 21.6 inches by the same reasoning. However for a helical resonator structure of these dimensions to be in resonance at 50 MHz, the formal design formulae in Macalpine specify a spiral coil with fewer than 2 turns and more than 10 inches of axial length along each turn (also the conductor used to wind the coil should be more than 1.7 inches in diameter). These values are in a parameter space, according to Macalpine et al., where use of helical resonators is undesirable.

It is, therefore, an object of the present invention to create a new and improved helical resonator plasma discharge structure which is compact and better suited for processing substrates, and is in particular better for processing substrates for semiconductor device manufacture. It is a further object of the present invention to provide convenient helical resonator plasma discharge structures which operate above 21 MHz and are suitable for processing large substrates.

SUMMARY OF THE INVENTION

It has been found that not only are the accepted dimensional scaling relationships for helical resonators given by Macalpine et al. bulky, cumbersome and sometimes impractical for plasma processing reactors, but that this scaling is in fact unnecessary for the operation of helical resonator plasma reactors. It has been further found that helical resonator plasma reactors with coil to shield diameter ratios greater than those hitherto believed to be useful can provide a larger plasma diameter and a greater integral flux of species from a specified resonator structure diameter. In fact such helical resonator discharges are an excellent source of species for procedures such as etching, chemical vapor deposition, surface modification and ion implantation.

Indeed, helical resonator plasma reactors which utilize a plasma volume inside a coil diameter that is more than 60 percent of the outer helical resonator shield diameter can readily operate with a loaded Q which is similar to the loaded Q found in reactors that conform to the criteria taught by Macalpine et al. Furthermore, coils for helical resonator reactors wound using conductors with diameters less than a factor of 0.4 times the pitch can operate with values of loaded system Q which are approximately the same as those found in helical resonator plasma reactors conforming to the dimensional ratios given by Macalpine et al.

DETAILED DESCRIPTION

Figure 1:
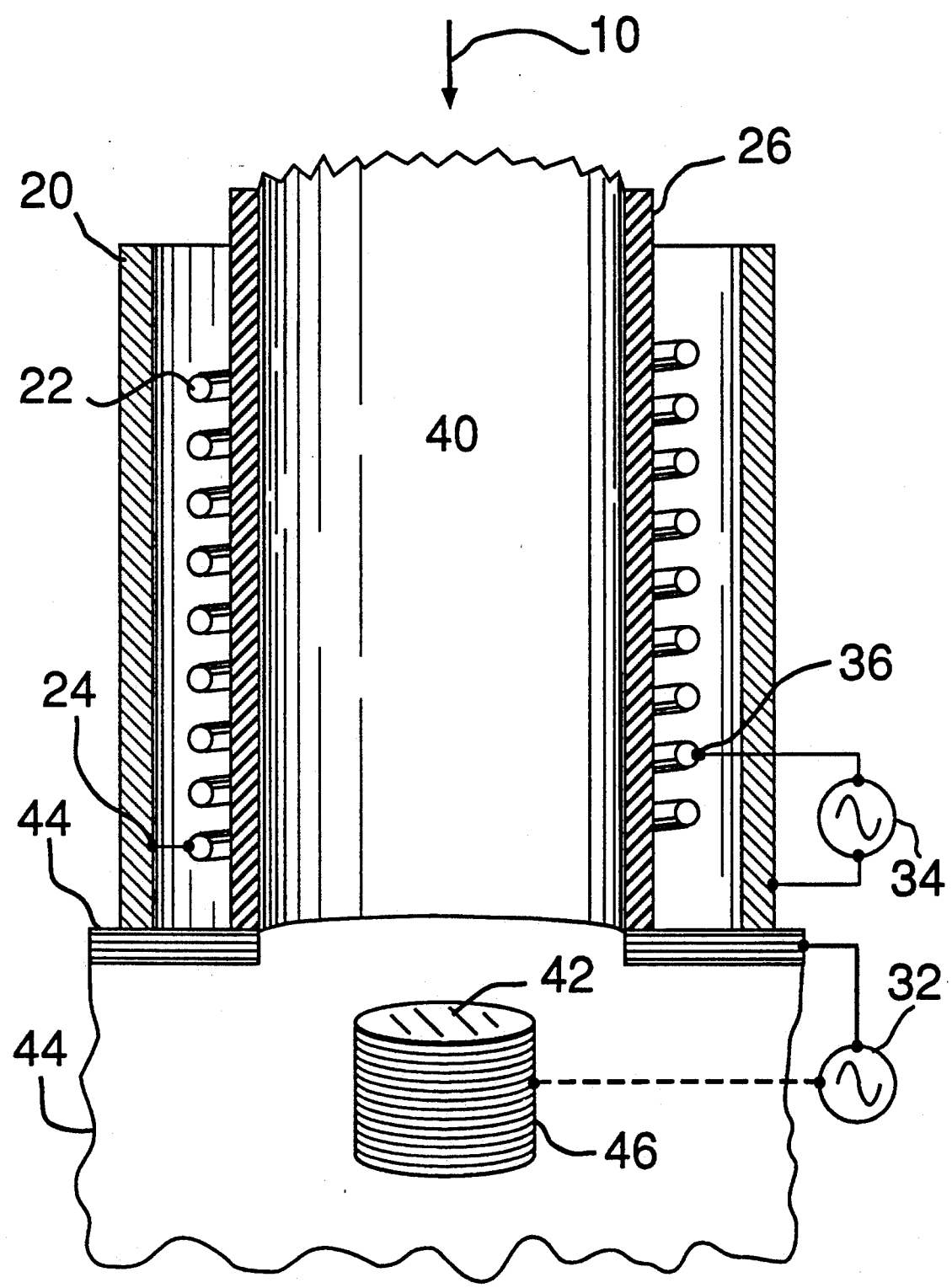
FIG. 1 is illustrative of a helical resonator plasma discharge apparatus suitable for practicing the invention.

The invention involves the use of a helical resonator with an inner coil diameter greater than 0.6 times the outer shield diameter to produce a plasma in a gas at low pressure (typically in the range of $10^{-5}$ Torr to 150 Torr) for processing such as etching procedures or deposition procedures. An inner coil dimension substantially larger than 0.6 times the shield has hitherto been considered inadequate for plasma reactors because structures incorporating such coils have lower unloaded Q values than those with coil diameters of 0.45 to 0.6 times the shield diameter. However it has been determined that a high unloaded Q is ordinarily superfluous and the practice of optimizing unloaded Q imposed burdensome and unnecessary constraints on helical resonator plasma reactors constructed to the previous art.

Practitioners of the art believed that a high unloaded resonator Q was imperative for efficient and reliable operation of helical resonator plasma processing reactors. For this reason, helical resonator plasma structures have hitherto been designed in conformance with the optimal Q sizing parameters taught by Macalpine et al. In general the unloaded Q of helical resonators used for plasma reactor structures has been designed to be more than 500. However, when a plasma discharge suitable for substrate processing is present in the resonator structure, the potentials and currents which determine the characteristics of the plasma depend on the Q established during operation of plasma discharge system. (This is known as the loaded Q of the resonator. The loaded Q is the ratio of the maximum instantaneous energy stored in the resonator during a cycle of the excitation frequency to the power dissipated in the resonator structure during a cycle of the RF excitation when a plasma is ignited.) It has been determined that the loaded Q during plasma processing of substrates in helical resonator reactors is unexpectedly low, generally less than about 50. It will be understood that this loaded Q is low and is substantially less than the unloaded Q, the magnitude of the unloaded Q is not a significant parameter for appropriate operation of the plasma reactor. (For this purpose, the unloaded Q is considered substantially less than the loaded Q when the unloaded Q is five times the loaded Q.) Thus this invention involves selecting dimensions for helical resonators used for plasma processing of device substrates that are more convenient and economical than helical resonators designed according to past art. The inventive helical resonators employ dimensional ratios outside of the range taught by Macalpine et al., and in particular utilize a coil diameter to shield diameter ratio, d/D, which is larger than 0.6. The unloaded Q is generally chosen to be at least four times the loaded Q. In practice, this criterion will usually be realized when the unloaded Q is designed to be larger than 250. The desired operating plasma processing conditions in the inventive helical resonator plasma discharge are adjusted by procedures such as adjusting the position of the tap (36) where the power source is connected to the coil (as shown in FIG. 1) to minimize power reflected to the RF generator, and adjusting the excitation frequency to resonance. A high $Z_o$ value for the resonator is helpful for anisotropic etching at low pressure. However the value of this parameter is not a direct function of Q and may be set within wide limits as in prior art. The main effect of reduced unloaded Q is that the plasma reactor will exhibit a lower electrical efficiency than a similar reactor conforming to the teachings of Macalpine et al. (For this purpose a similar reactor has the same inside dielectric plasma tube diameter.) Of course it is clear, according to teachings of this invention, that Macalpine's criteria are extremely restrictive and it may not always be possible to build which conforms to Macalpine's criteria and is similar in this sense. The electrical efficiency of loaded resonators such as helical resonator plasma reactors is governed by the ratio of unloaded to loaded Q values. An electrical efficiency of 80 percent is generally acceptable for conventional parallel plate or hexode plasma reactor and matching network combinations generally used for processing. Helical resonator plasma reactors require no matching network and an unloaded Q in excess of four times the loaded Q is acceptable.

Operation of an ordinary helical resonator plasma reactor with dimensions conforming to Macalpine et al. illustrate the unexpectedly low Q characterizing past practice. A quarter wave resonator was constructed according to the formulae in Macalpine et al. using a 12 inch long, 8 in. O.D. cylindrical copper shield containing a 27 turn 6.5 in. long, helical coil, 22, of ⅛ in. O.D. copper tubing, 4.5 in. O.D. centered within the shield. The bottom of the coil was short circuited to the shield by a silver solder connection (24) and the top of the coil was open circuited. The resonant frequency of this structure was approximately 9 MHz when there was no plasma ignited. Power was coupled into the resonator by connecting a clip to the coil approximately 1.5 turns above the shorted end. A quartz discharge tube approximately 60 mm O.D. passed concentrically through the helical coil and was mated to a quartz walled reaction chamber, (44), by o-ring seals. A plasma was ignited in a feed gas consisting of 20 percent oxygen and 80 percent nitrogen and the input power was determined to be 46 watts at the operating resonant frequency of 8.7 MHz. The frequency was then varied and the loaded Q of the resonator was determined to be less than 44.

According to the teachings of this invention, a discharge tube (26) is chosen to be of a convenient size for processing a substrate (42). A coil (22) is chosen to have a convenient inside diameter that is larger than the discharge tube. Then a coil length, shield diameter and shield length are determined by the following iterative procedure.

A tentative inner diameter for the shield is chosen which must be larger than the outer diameter of the coil and large enough to avoid parasitic electrical breakdown between the coil (22) and shield (20), but the inner shield diameter is selected to be about 1.7 times the diameter of the coil (22), or less, in order to create a compact structure. The coil is wound from a conductor material such as copper wire, copper tubing or a flat copper strip with a conductor diameter (or lateral width dimension in the case of a flat conducting strip) selected for convenience in construction and low resistance. The conductor and/or the outer shield may be silver plated to increase their conductivity and thereby improve the Q of the resonator.

The extended length of the coiled conductor (22) (this length is equal to the number of turns multiplied by $\pi$ times the mean diameter of the coil) is initially chosen to be one quarter of the free space wavelength at the desired frequency of operation (this length, in meters, is $3 \times 10^8/f$, where f is the excitation frequency in Hertz). (Alternatively the length is chosen to be a multiple of this length or a multiple of a half wavelength when a multiple half wavelength helical resonator reactor is desired). The number of turns that are required is computed by dividing this quantity by the chosen coil diameter and reducing this quantity by approximately 15 percent to compensate for errors in the approximation. Ordinarily the coil is wound with a pitch, $\tau$, equal to twice the diameter, $d_o$ (or width of the conductor if a flat conductor is utilized). However the pitch may be made larger than this quantity if, for example, it is desirable to form a larger volume inside the coil in order to attain a larger plasma volume in the helical resonator plasma discharge reactor. The length of the outer conducting shield (20) is set, approximately, to the coil (22) length plus an added increment of one half the diameter of the conducting shield. (This added increment may be shortened somewhat without adversely influencing operation. In practice, the vacuum enclosure (44) or protective metallic panels above the resonator structure can act somewhat as an extension of the shield.) The coil is held centered within the conducting shield by insulating support structures.

The unloaded Q, $Z_o$ and unloaded resonant frequency of the structure are estimated from the formulae given by Sichak. If the resonant frequency computed by these formulae is lower than the desired value, the number of turns comprising the helical inner conductor is reduced and the computation is repeated iteratively. Generally an unloaded Q in excess of 200 is desirable to attain a resonable power efficiency (approximately 80 percent or more) when the plasma is operated. The unloaded Q corresponding to a design is also estimated by the relationships in Sichak. If the unloaded Q so computed is less than the desired vlaue, the diameter of the outer conducting shield (10) is increased or the pitch of the inner coil (22) is adjusted to increase the estimated Q corresponding to the resonator structure. At high frequencies (e.g. above 27 MHz), when necessary, it may be more convenient to increase the unloaded resonator Q by employing a larger conductor diameter or width, or by silver plating the coil and/or shield. Effects of these procedures are in Sichak and Macalpine et al.

The tube (26), coil (22) and shield (20) are sized in this manner and assembled to comprise a helical resonator plasma discharge using vacuum components and techniques which are well known to those skilled in the art (for example those described by Steinberg et al. and incorporated herein by reference). Exact resonance is easily achieved by designing for a frequency slightly higher than the desired resonance and adjusting resonance downward with trimming capacitance connected between the coil (22) and shield (20) as described by Steinberg et al. and Macalpine et al.

Reaction gases (10) are admitted to the plasma reaction tube (26) and RF power from a source (34) is used to sustain the plasma. A substrate (42) to be processed may be held on a conducting or insulating support (46) (an electrically conducting support is depicted in the figure), as shown, in a chamber (44) which is connected to the plasma volume (40). Alternatively, the substrate (42) may be supported in another region of the vacuum system such as a position within the plasma in the dielectric tube volume (40). In practice coupling of power to the resonator is accomplished by iteratively moving the tap position (36) and adjusting the frequency of the RF excitation source (34) to ignite the plasma and achieve a low standing wave ratio on the connecting line. (An alternative procedure is to change the resonant frequency of the helical resonator structure by connecting a trimming capacitance between the coil (22) and outer shield (20) as described by Steinberg et al.)

An additional power source (32) may be optionally connected to the conducting substrate support (46) and powered to increase negative bias voltage on the substrate. Negative bias is useful, for example, for stress control in deposition processes.

In some applications. the gas flow (10), gas composition, RF power source (34) or optional bias power source (32) are pulsed to improve processing characteristics

EXAMPLE

A quartz discharge tube (26) approximately 3.7 inches OD is passed through a resonator constructed from a 10 inch long, 6.5 inch ID cylindrical copper shield (20) containing a 14 turn, 7.3 inch long helical coil (22) of ¼ inch OD copper tubing wound to a 4.6 inch OD. The fundamental unloaded resonance of this structure was approximately 13 MHz. The quartz tube is mated to a reaction chamber (44) through o-ring seals and 100 standard cubic centimeters per minute of a gas mixture consisting of 8 percent oxygen by volume and 92 percent $CF_4$ by volume are admitted to the vacuum-sealed top of the quartz discharge tube (26). The pressure in vacuum chamber is maintained at 0.4 Torr. A plasma discharge is initiated by coupling an RF amplifier and sine wave frequency generator to the resonator coil at a point approximately 1.5 turns above the shorted end (24), setting the generator to deliver a forward power of 260 watts and lowering the oscillator frequency below 13 MHz to maximize the brightness of the visible glow emanating from the quartz tube (26). The total power input to the resonator is then adjusted to be approximately 260 watts. A 3-inch OD water cooled substrate support is located 4 inches below the bottom of the resonator shield (20).

A 3000 angstrom film of undoped polycrystalline silicon is deposited by chemical vapor deposition onto a 3-inch silicon wafer covered by an 800 angstrom thick layer of $SiO_2$. A 1 micron thick layer of AZ-1350J resist (a material manufactured by American Hoechst Company) is patterned over the polysilicon layer. The wafer (42) is centered on the water-cooled support (46), and exposed to entities from the plasma for about 4 minutes. Subsequently the wafer is examined and it is found that the polysilicon layer has been uniformly cleared from areas exposed to the plasma through openings in the resist mask.

What is claimed is:

1. A process for fabricating a device comprising the steps of subjecting a substrate to a composition of entities and employing the resulting substrate for completion of said device, characterized in that one of said entities emanates from a species generated by a gaseous discharge within a helical resonator having an outer shield, said helical resonator having a spiral coil with a mean diameter at least 0.669 times the inside diameter of the outer shield.

2. The process of claim 1 wherein said device comprises a semiconductor device.

3. The process of claim 1 wherein the gas pressure is more than 15 mTorr.

4. The process of claim 1 wherein a bias is applied to said substrates.

5. The process of claim 1 wherein said helical resonator is subjected to an external magnetic field.

6. The process of claim 1 wherein said helical resonator is pulsed.

7. The process of claim 6 wherein said pulsing corresponds to an associated change in processing conditions.

8. The process of claim 7 wherein said change comprises a periodic varying of said gas.

9. The process of claim 1 wherein more than one helical resonator is employed.

10. The process of claim 1 wherein said resonator comprises a half wave resonator or a multiple of a half wave resonator.

11. The process of claim 10 wherein said helical resonator is grounded on one or both ends of said helix.

12. The process of claim 1 wherein an electric field, or a magnetic field, is employed to affect the course of said species from said resonator to said substrate.

13. The process of claim 1 wherein a longitudinally conducting member having relatively low circumferential conduction is present in said resonator.

14. The process of claim 1 wherein said substrate is contained within the cylindrical volume subtended by the outer helical resonator shield.

15. A process for modification of a substrate comprising the steps of subjecting the substrate to a composition of entities and employing the resulting substrate for completion of a useful article characterized in that one of said entities emanates from a species generated by a gaseous discharge in a helical resonator having an outer shield, said helical resonator having a spiral coil with a mean diameter at least 0.669 times the inside diameter of the outer shield.

16. The process of claim 15 wherein said species is implanted in said substrate.

17. The process of claim 15 wherein said species interacts with a second species to form said entity.

18. The process of claim 15 wherein a longitudinally conducting member having relatively low circumferential conduction is present in said resonator.

* * * * *